(12) United States Patent
Choi

(10) Patent No.: US 9,105,864 B2
(45) Date of Patent: Aug. 11, 2015

(54) ORGANIC LIGHT-EMITTING DISPLAY DEVICE AND METHOD OF MANUFACTURING THE SAME

(71) Applicant: Chaun-Gi Choi, Yongin (KR)

(72) Inventor: Chaun-Gi Choi, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 2 days.

(21) Appl. No.: 13/833,818

(22) Filed: Mar. 15, 2013

(65) Prior Publication Data

US 2014/0097411 A1      Apr. 10, 2014

(30) Foreign Application Priority Data

Oct. 9, 2012   (KR) .................. 10-2012-0112084

(51) Int. Cl.
| | | |
|---|---|---|
| *H01G 4/33* | (2006.01) | |
| *H01G 4/08* | (2006.01) | |
| *H01L 51/52* | (2006.01) | |
| *H01L 27/12* | (2006.01) | |
| *H01L 27/32* | (2006.01) | |

(52) U.S. Cl.
CPC ........ *H01L 51/5203* (2013.01); *H01L 27/1225* (2013.01); *H01L 27/1255* (2013.01); *H01L 27/3279* (2013.01); *H01L 27/3262* (2013.01); *H01L 27/3265* (2013.01); *H01L 2227/323* (2013.01)

(58) Field of Classification Search
CPC ....... H01G 4/33; H01G 4/085; H01G 4/1209; H01G 11/06; H01G 11/08; H01G 11/28; H01G 11/50; H01G 11/56; H01G 4/01; H01G 4/012; H01G 4/1227; H01G 9/025; H01G 9/15; H01G 9/28
USPC ........... 257/40, 57, 59, 66, 72, 347, 350, 351, 257/532; 438/34, 23, 149, 157
See application file for complete search history.

(56) References Cited

U.S. PATENT DOCUMENTS

| | | | |
|---|---|---|---|
| 8,093,585 B2 | 1/2012 | Nishimura et al. | |
| 2004/0263508 A1* | 12/2004 | Koyama et al. | 345/212 |
| 2006/0231957 A1* | 10/2006 | Kim et al. | 257/759 |
| 2007/0188089 A1* | 8/2007 | Choi et al. | 313/506 |
| 2010/0237465 A1* | 9/2010 | Stribley et al. | 257/532 |
| 2010/0245402 A1* | 9/2010 | Choi et al. | 345/690 |
| 2011/0013106 A1 | 1/2011 | Liu | |

(Continued)

FOREIGN PATENT DOCUMENTS

| | | |
|---|---|---|
| JP | 2009-128577 A | 6/2009 |
| JP | 2011-023728 A | 2/2011 |

(Continued)

*Primary Examiner* — Steven Loke
*Assistant Examiner* — Didarul Mazumder
(74) *Attorney, Agent, or Firm* — Lee & Morse, P.C.

(57) ABSTRACT

An organic light-emitting display device may include a plurality of scan lines, a plurality of data lines, and a plurality of pixels located at an intersection region of the scan line and the data line, wherein the organic light-emitting display device includes a thin film transistor including a gate electrode on a different layer than a scan line, an active layer on the gate electrode, and source and drain electrodes that are in contact with source and drain regions of the active layer, and a capacitor including a first capacitor electrode on the same layer as the scan line, a second capacitor electrode on the gate electrode, and a third electrode on the same layer as the source and drain electrodes.

19 Claims, 14 Drawing Sheets

(56) References Cited

U.S. PATENT DOCUMENTS

| | | | |
|---|---|---|---|
| 2011/0108840 A1* | 5/2011 | Lee et al. | 257/59 |
| 2011/0108848 A1* | 5/2011 | Lee et al. | 257/72 |
| 2011/0220888 A1* | 9/2011 | Choi et al. | 257/43 |
| 2012/0171794 A1* | 7/2012 | Yang et al. | 438/34 |

FOREIGN PATENT DOCUMENTS

| | | |
|---|---|---|
| KR | 10 2003-0055504 A | 7/2003 |
| KR | 10 2009-0105561 A | 10/2009 |
| KR | 10-1050466 B1 | 7/2011 |
| KR | 10-1094280 B1 | 12/2011 |

* cited by examiner

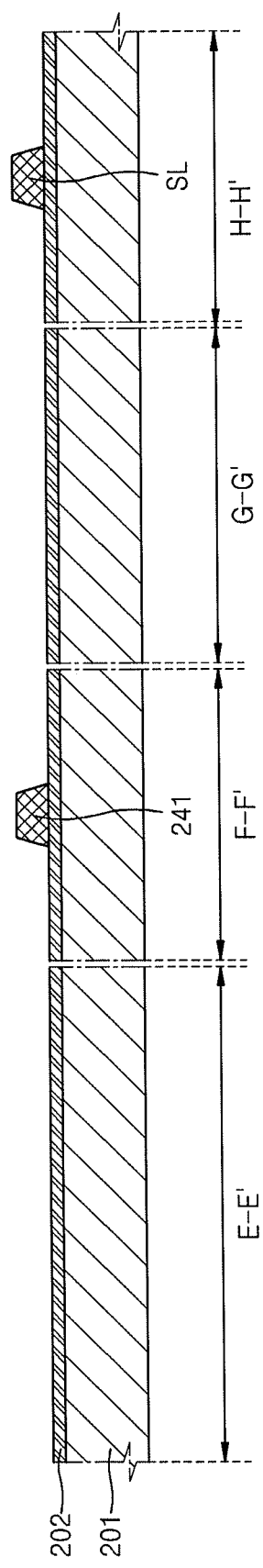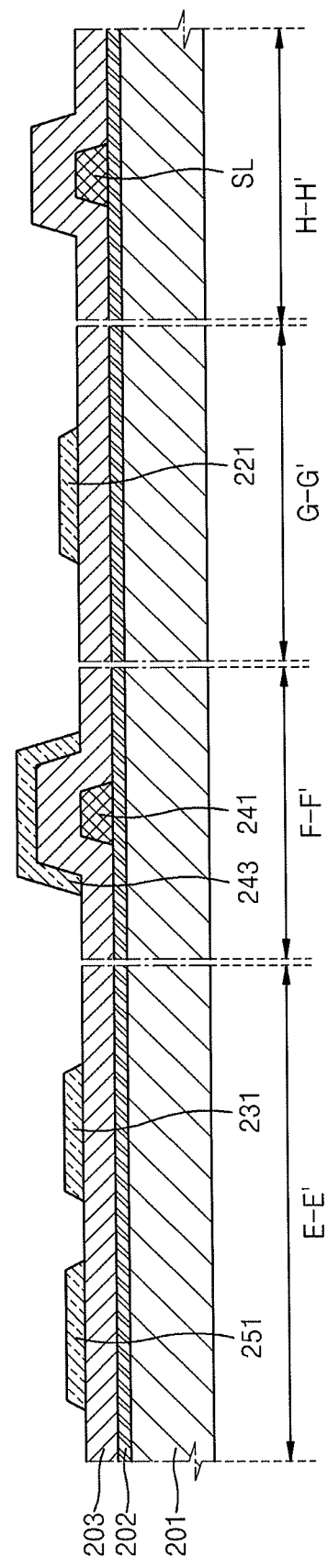

ORGANIC LIGHT-EMITTING DISPLAY DEVICE AND METHOD OF MANUFACTURING THE SAME

CROSS-REFERENCE TO RELATED PATENT APPLICATION

This application claims priority under 35 U.S.C. 119 to and the benefit of Korean Patent Application No. 10-2012-0112084, filed on Oct. 09, 2012, in the Korean Intellectual Property Office, the disclosure of which is incorporated herein in its entirety by reference.

BACKGROUND

1. Field of the Invention

Embodiments relate to an organic light-emitting display device and a method of manufacturing the same.

2. Description of the Related Art

Flat panel display devices, such as organic light-emitting display devices or liquid crystal display devices, include a plurality of pixels including thin film transistors (TFTs), capacitors, and wiring connecting the TFTs and capacitors.

Each pixel of an organic light-emitting display device having TFTs receives signals through scan lines and data lines for transmitting scan signals and data signals, and emits lights using power lines for supplying power to each pixel.

However, the scan lines, data lines, and power lines are wires formed of metal, thus the signals supplied to pixels placed far from where the signals are supplied may be distorted due to line resistance. Therefore, a luminance of the organic light-emitting display device may be uneven, and accordingly, a reliability of the organic light-emitting display device may be decreased.

SUMMARY

One or more embodiments is directed to providing an organic light-emitting display device including a plurality of scan lines and a plurality of data lines, and a plurality of pixels each located at an intersection region of the scan line and the data line, wherein the organic light-emitting display device includes a thin film transistor including a gate electrode disposed on a different layer than a scan line, an active layer on the gate electrode, and source and drain electrodes in contact with source and drain regions of the active layer; and a capacitor including a first capacitor electrode disposed on a same layer as the scan line, a second capacitor electrode disposed on the gate electrode, and a third capacitor electrode disposed on the same layer as the source and drain electrodes.

The active layer may be formed of an oxide semiconductor.

A thickness of the gate electrode may be thinner than a thickness of the scan line, and the scan line may be a low resistance wire.

The capacitor may further include a fourth capacitor electrode disposed on the third capacitor electrode. The organic light-emitting display device may further include a first insulating layer disposed between the first capacitor electrode and the second capacitor electrode, a second insulating layer and a third insulating layer disposed between the second capacitor electrode and the third capacitor electrode, and a fourth insulating layer disposed between the third capacitor electrode and the fourth capacitor electrode.

The organic light-emitting display device may further include a pixel electrode disposed on the source and drain electrodes and on the same layer as the fourth capacitor electrode.

The organic light-emitting display device may further include a pixel electrode disposed on the same layer as the gate electrode and the second capacitor electrode. Also, the organic light-emitting display device may further include a first insulating layer disposed between the first capacitor electrode and the second capacitor electrode, and a second insulating layer and a third insulating layer disposed between the second capacitor electrode and the third capacitor electrode.

The scan line and the gate electrode may be electrically connected through contact holes formed in an insulating layer between the scan line and the gate electrode.

One or more embodiments is directed to providing a method of manufacturing an organic light-emitting display device, the method including forming a first capacitor electrode on the same layer as a scan line; forming a first insulating layer on the first capacitor electrode and forming a gate electrode and a second capacitor electrode on the first insulating layer; forming a second insulating layer on the gate electrode and the second capacitor electrode and forming an active layer which overlaps with the gate electrode on the second insulating layer; forming a third insulating layer including openings, which expose a part of source and drain regions of the active layer, in the active layer; and forming a third capacitor and forming source and drain electrodes that are in contact with the source and drain regions through the openings, on the third insulating layer.

The active layer may be formed of an oxide semiconductor.

A thickness of the gate electrode may be thinner than a thickness of the scan line. Also, the scan line may be a low resistance wire.

The method may further include forming a fourth insulating layer on the source and drain electrodes and forming a fourth capacitor electrode on the fourth insulating layer. The method may further include forming a pixel electrode on the same layer as the fourth capacitor electrode. Also, the method may further include forming a fifth insulating layer, which has an opening that exposes a part of the pixel electrode, on the pixel electrode and the fourth capacitor electrode.

The method may further include forming the pixel electrode on the same layer as the gate electrode and the second capacitor electrode. The method may further include forming a fourth insulating layer, which has an opening that exposes a part of the pixel electrode, on the pixel electrode, which is partially exposed by the opening included in the second insulating layer and the third insulating layer, the third capacitor electrode, and the source and drain electrodes.

The method may further include forming an electrode pattern that electrically connects the scan line and the gate electrode through contact holes formed in an insulating layer between the scan line and the gate electrode.

BRIEF DESCRIPTION OF THE DRAWINGS

The above and other features will become more apparent by describing in detail exemplary embodiments thereof with reference to the attached drawings in which:

FIGS. 12 to 18 are cross-sectional views of FIG. 11 cut through lines E-E', F-F', G-G', and H-H' to describe stages in a method of manufacturing the organic light-emitting display device, according to an embodiment.

DETAILED DESCRIPTION

Figure 1:
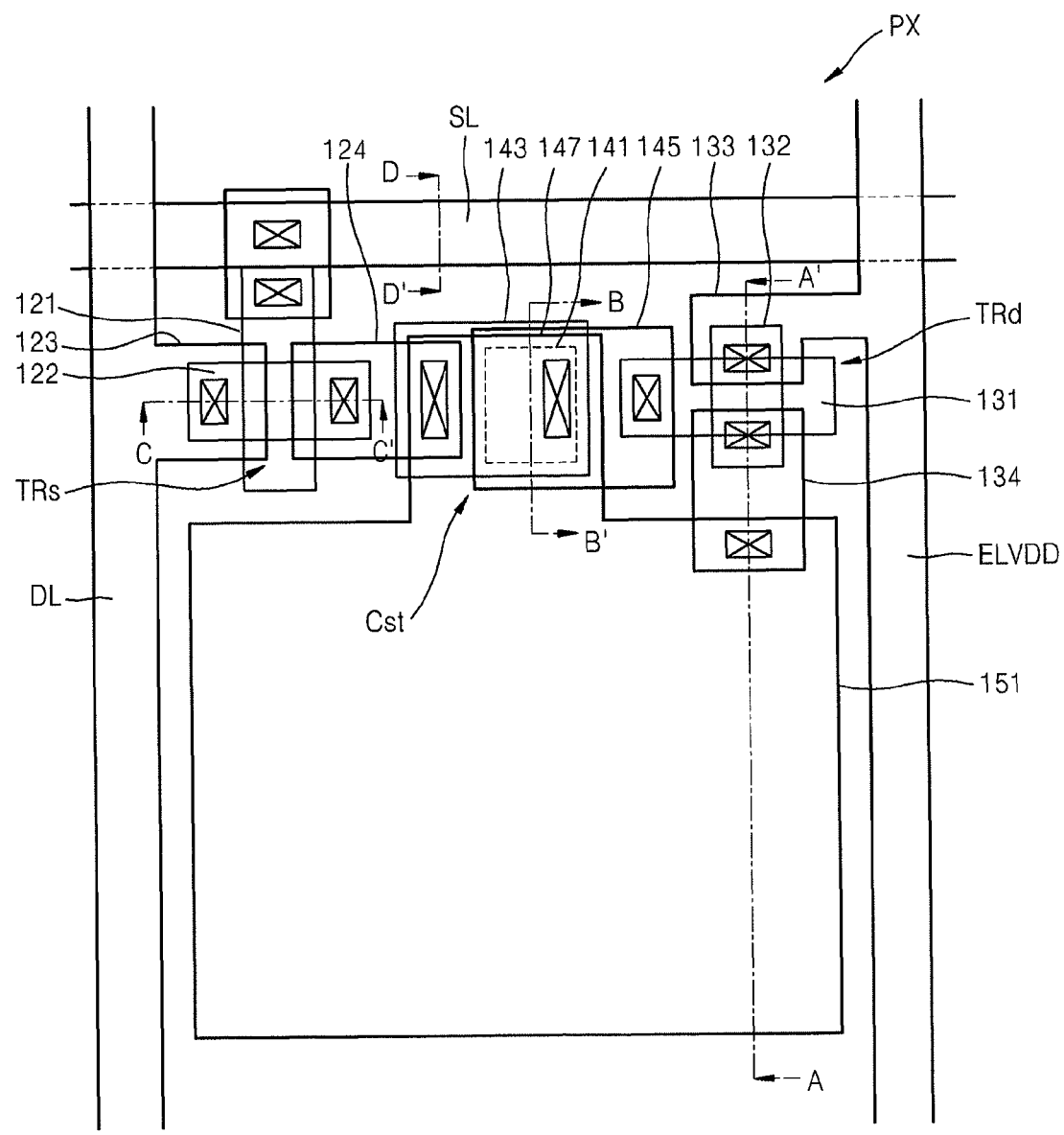
FIG. 1 is a plan view of a single pixel of an organic light-emitting display device according to an embodiment.

As used herein, the term "and/or" includes any and all combinations of one or more of the associated listed items.

Hereinafter, the exemplary embodiments according will be described in detail with reference to the accompanying drawings.

Like reference numerals refer to like elements. In the description, if it is determined that a detailed description of commonly-used technologies or structures related to the invention may unnecessarily obscure the subject matter, the detailed description will be omitted.

In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a plan view of a single pixel of an organic light-emitting display device according to an embodiment.

The organic light-emitting display device according to an embodiment includes a plurality of scan lines SL and a plurality of data lines DL on a substrate 101, and a plurality of pixels PX each located at an intersection region of the scan line SL and the data line DL. Referring to FIG. 1, each of the pixels PX includes an organic light-emitting diode for realizing colors in response to a data signal, a driving transistor TRd for applying driving current according to the data signal to the organic light-emitting diode, a switching transistor TRs that turns on/off the driving transistor TRd by transmitting the data signal according to a scan signal, and a capacitor Cst for storing voltage that corresponds to the data signal. Here, the pixel PX may further include a plurality of thin film transistors TFTs and capacitors to compensate for a threshold voltage of the driving transistor TRd.

The switching transistor TRs includes a gate electrode 121 on a layer above the scan line SL, an active layer 122 on the gate electrode 121, and source and drain electrodes 123 and 124 that are electrically connected to two terminal ends of the active layer 122 through contact holes. The gate electrode 121 is electrically connected to the scan line SL through contact holes. One of the source and drain electrodes 123 and 124 are electrically connected to the data line DL and the other is electrically connected to a second capacitor electrode 143 of the capacitor Cst through contact holes. One of the source and drain electrodes 123 and 124 that is electrically connected to the data line DL may be extended from and integrated with the data line DL.

The driving transistor TRd includes a gate electrode 131 on a layer above the scan line SL, an active layer 132 on the gate electrode 131, and source and drain electrodes 133 and 134 that are electrically connected to the two terminal ends of the active layer 132 through contact holes. The gate electrode 131 is electrically connected to a third capacitor electrode 145 of the capacitor Cst through contact holes. One of the source and drain electrodes 133 and 134 is electrically connected to a driving voltage supply line ELVDD, and the other is electrically connected to a pixel electrode 151 of the organic light-emitting diode EL through contact holes. One of the source and drain electrodes 133 and 134 that is electrically connected to the driving voltage supply line ELVDD may extend from and may be integrated with the driving voltage supply line ELVDD.

The capacitor Cst includes a first capacitor electrode 141 on the same layer as the scan line SL, a second capacitor electrode 143 on the first capacitor electrode 141 and formed on the same layer as the gate electrodes 121 and 131, a third capacitor electrode 145 on the second capacitor electrode 143 and formed on the same layer as the source and drain electrodes 123 and 124 and 133 and 134, and a fourth capacitor electrode 147 on the third capacitor electrode 145 and formed on the same layer as the pixel electrode 151 of the organic light-emitting diode EL. The first capacitor electrode 141 and the third capacitor electrode 145 are electrically connected through contact holes. The fourth capacitor electrode 147 may be extended from and integrated with the pixel electrode 151.

FIGS. 2 to 10 are cross-sectional views of FIG. 1 cut through lines A-A', B-B', C-C', and D-D' to describe a stages in a method of manufacturing the organic light-emitting display device, according to an embodiment.

Figure 2:
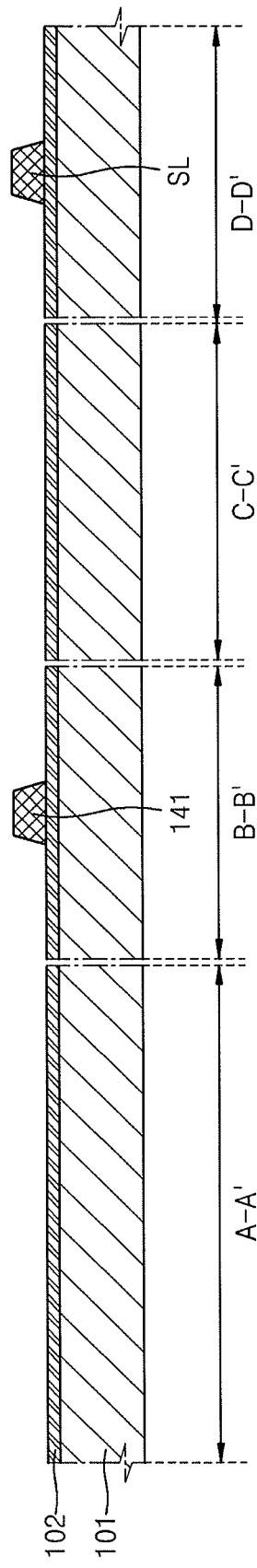
FIGS. 2 to 10 are cross-sectional views of FIG. 1 cut through lines A-A', B-B', C-C', and D-D' to describe stages in a method of manufacturing the organic light-emitting display device, according to an embodiment.

Referring to FIG. 2, a buffer layer 102 is formed on the substrate 101, a first mask (not shown) is formed on the buffer layer 102, and the scan line SL and the first capacitor electrode 141 of the capacitor Cst are formed on the buffer layer 102 by masking with a first mask (not shown).

The substrate 101 may be formed of a transparent glass material, mainly including $SiO_2$. However, the substrate 101 of the present embodiment is not limited thereto, and may be formed of various materials such as, e.g., transparent plastic material or metal material.

The buffer layer 102 serves as a barrier layer and/or a blocking layer to prevent diffusion of impurity ions and permeation of moisture or external air, and to planarize a surface of the substrate 101. The buffer layer 102 may be formed using $SiO_2$ and/or $SiN_x$ by various deposition methods, such as plasma enhanced chemical vapor deposition (PECVD), atmospheric pressure chemical vapor deposition (APCVD), and low pressure chemical vapor deposition (LPCVD).

The scan line SL and the first capacitor electrode 141 may be formed simultaneously by stacking a first conductive layer on the substrate 101 and patterning the first conductive layer. The first conductive layer includes at least one metal material in the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first conductive layer may be formed as a single layer or multiple layers. A first conductive layer may include a metal material with a low resistance, such as Al or Cu, but the first conductive layer may include other metal materials to form the first conductive layer as a single layer or multiple layers with an increased thickness.

Figure 3:
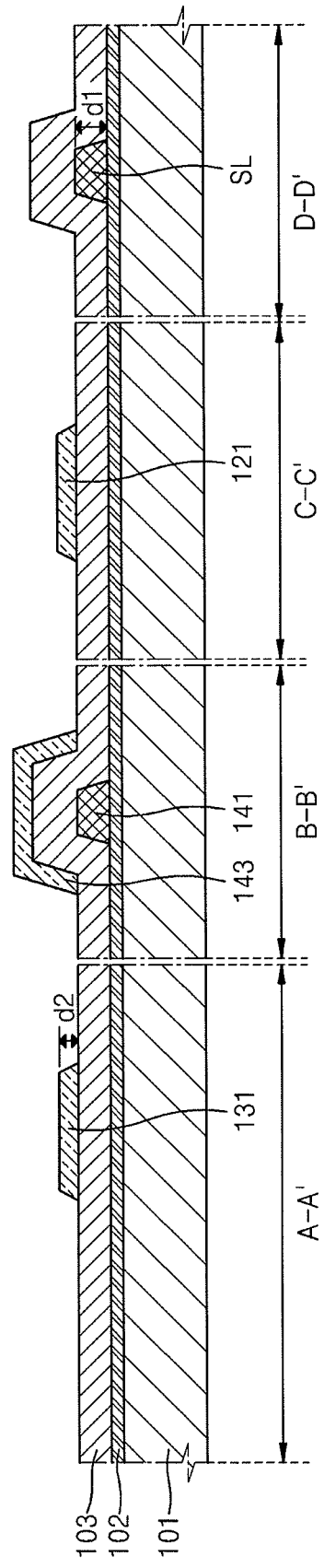

Next, as shown in FIG. 3, a first insulating layer 103 is formed on the substrate 101, and then, the gate electrode 131 of the driving transistor TRd, the gate electrode 121 of the switching transistor TRs, and the second capacitor electrode 143 of the capacitor Cst are formed on the first insulating layer 103 by masking with a second mask (not shown). The second capacitor electrode 143 overlaps the first capacitor electrode 141. In particular, the second capacitor electrode 143 may be wider than the first capacitor electrode 141 to entirely overlap the first capacitor electrode 141.

The first insulating layer 103 may be formed of at least one organic insulation material selected from the group of polyimide, polyamide, acrylic resin, benzocyclobutene, and phenol resin, or at least one inorganic insulation material selected from the group of $SiO_2$, $SiN_x$, $Al_2O_3$, $CuO_x$, $Tb_4O_7$, $Y_2O_3$, $Nb_2O_5$, and $Pr_2O_3$. Also, the first insulating layer 103 may include alternating layers of organic insulation materials and inorganic insulation materials.

The gate electrodes 121 and 131 and the second capacitor electrode 143 may be formed simultaneously by depositing the second conductive layer on the first insulating layer 103 and patterning the second conductive layer.

The second conductive layer includes at least one metal material selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and the second conductive layer may be formed as a single layer or multiple layers. The second conductive layer may include at least one transparent conductive material selected from the group of indium tin oxide (ITO), indium zinc oxide (IZO), zinc oxide (ZnO), indium oxide ($In_2O_3$), indium gallium oxide (IGO), and aluminum zinc oxide (AZO). A thickness d2 of the second conductive layer may be thinner than a thickness d1 of the first conductive layer. Thus, the thickness d2 of the gate electrodes 121 and 131 is thinner than the thickness d1 of the scan line SL.

Figure 4:
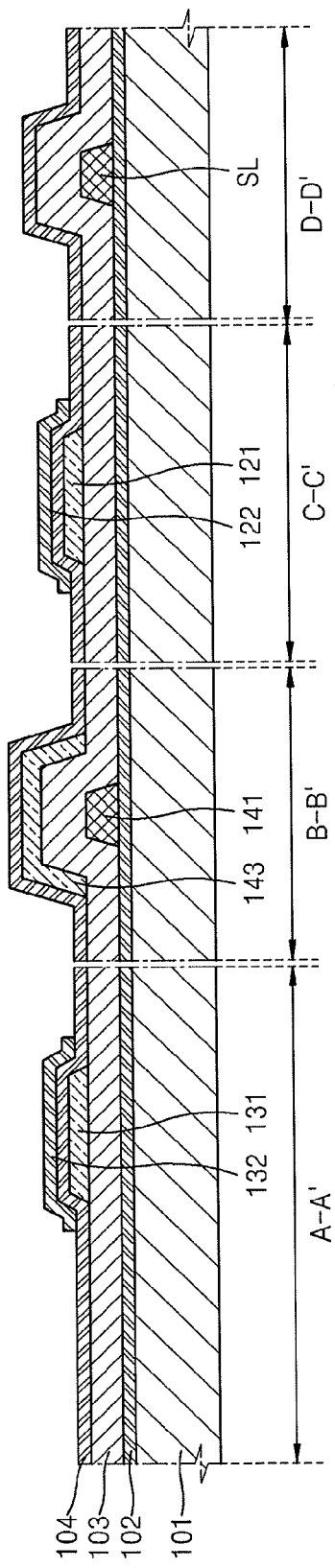

Referring to FIG. 4, the active layers 122 and 132 are formed on the gate electrodes 121 and 131 by masking with a third mask (not shown).

The second insulating layer 104 and an oxide semiconductor are deposited on the substrate 101, on which the gate electrodes 121 and 131 and the first capacitor electrode 141 are formed, and then, the oxide semiconductor is patterned to form the active layers 122 and 132. The active layers 122 and 132 each provide a channel region, a source region, and a drain region, wherein the channel region overlaps the gate electrodes 121 and 131.

The second insulating layer 104 serves as a gate insulating layer and may be formed of an inorganic insulation material, such as $SiN_x$ or $SiO_x$, or an organic insulation material. According to an embodiment, the scan line SL formed by the first conductive layer and the gate electrodes 121 and 131 formed by the second conductive layer may be formed apart, the gate electrodes 121 and 131 may be thinner than the scan line SL, which is a wire with low resistance. Thus, a thickness of the second insulating layer 104 may also be thin. Therefore, a size of a TFT may be reduced.

A TFT including the oxide semiconductor has excellent device characteristics and is processable at a low temperature. Thus, such a TFT is considered as an optimal device in a backplane for a flat panel display. In addition, the TFT including the oxide semiconductor is transparent within a band of visible light and flexible, thus the TFT may be used in a transparent display device or a flexible display device. The oxide semiconductor may contain at least one element selected from the group of gallium (Ga), indium (In), stannum (Sn), zirconium (Zr), hafnium (Hf), and vanadium (V). For example, the oxide semiconductor may include at least one selected from the group of ZnO, $SnO_2$, $In_2O_3$, $Zn_2SnO_4$, $Ga_2O_3$, and $HfO_2$. Also, the active layer 132 may be formed of a transparent oxide semiconductor. Examples of the transparent oxide semiconductor include, for example, Zn oxide, Sn oxide, Ga—In—Zn oxide, In—Zn oxide, and In—Sn oxide, but are not limited thereto.

Figure 5:
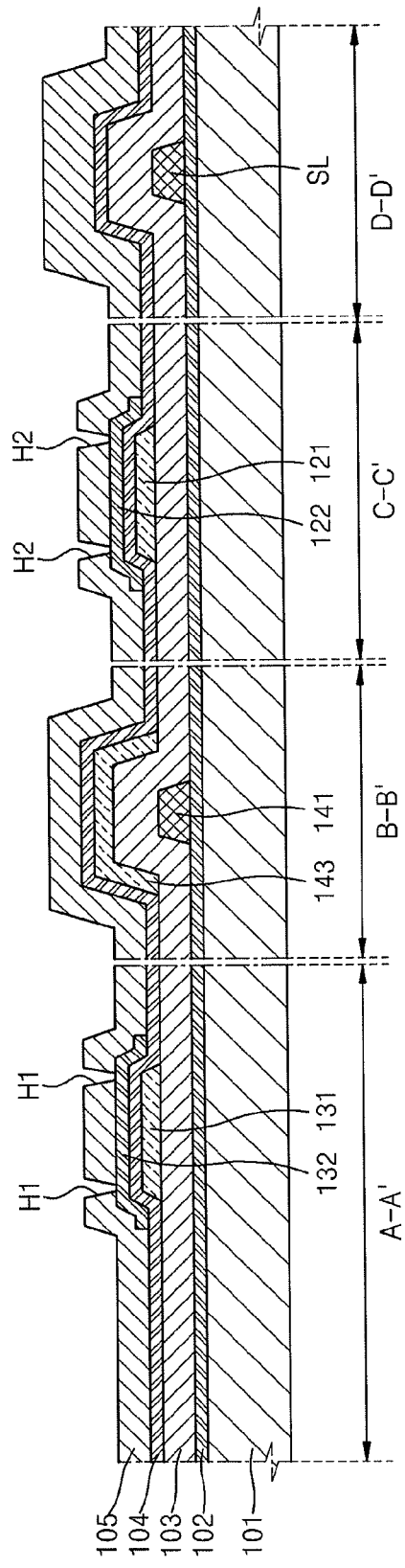

Referring to FIG. 5, a third insulating layer 105 is stacked on the active layers 122 and 132, and openings H1 and H2 exposing a part of the source and drain regions of the active layers 122 and 132 are formed by masking with a fourth mask (not shown).

The third insulating layer 105 serves as an inter-layer dielectric and may be formed of an inorganic insulation material, such as $SiN_x$ or $SiO_x$, or an organic insulation material.

Figure 6:
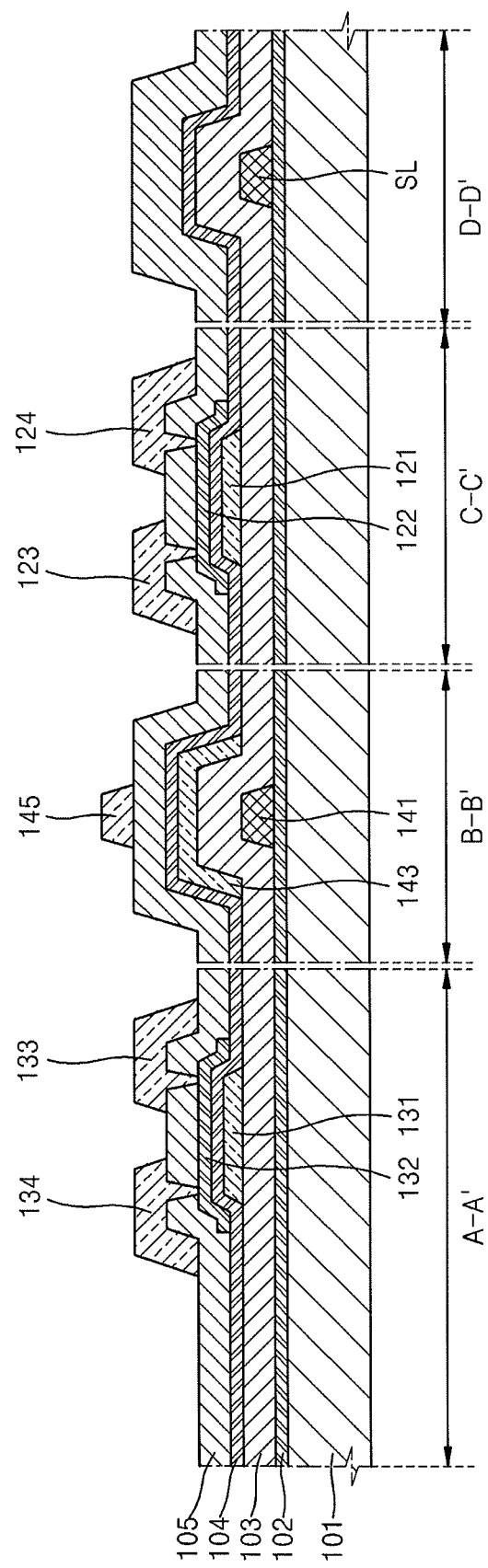

Next, referring to FIG. 6, the source electrodes 123 and 133 and the drain electrodes 124 and 134 of the transistors TRd and TRs are formed by masking with a fifth mask (not shown).

The openings H1 and H2 of the third insulating layer 105 are buried by the source electrodes 123 and 133 and the drain electrodes 124 and 134 that are formed as a single layer of multiple layers. The source electrodes 123 and 133 and the drain electrodes 124 and 134 are respectively in contact with the source regions and the drain regions of the active layers 122 and 132 through the openings H2 and H1. The source electrodes 123 and 133 and the drain electrodes 124 and 134 may be formed of a conductive material or by patterning a third conductive layer including, for example, a metal such as Cr, Pt, Ru, Au, Ag, Mo, Al, W, Cu, or AlNd, or a conductive oxide such as ITO, GIZO, GZO, AZO, InZnO (IZO), or AlZnO (AZO).

Also, the third capacitor electrode 145 of the capacitor Cst may be formed by patterning the third conductive layer at the same time the source electrodes 123 and 133 and the drain electrodes 124 and 134 are formed by patterning.

Although not shown in the drawings, the data line DL and the driving voltage supply line ELVDD may be formed at the same time when the source electrodes 123 and 133, the drain electrodes 124 and 134, and the third capacitor electrode 145 are formed.

Figure 7:
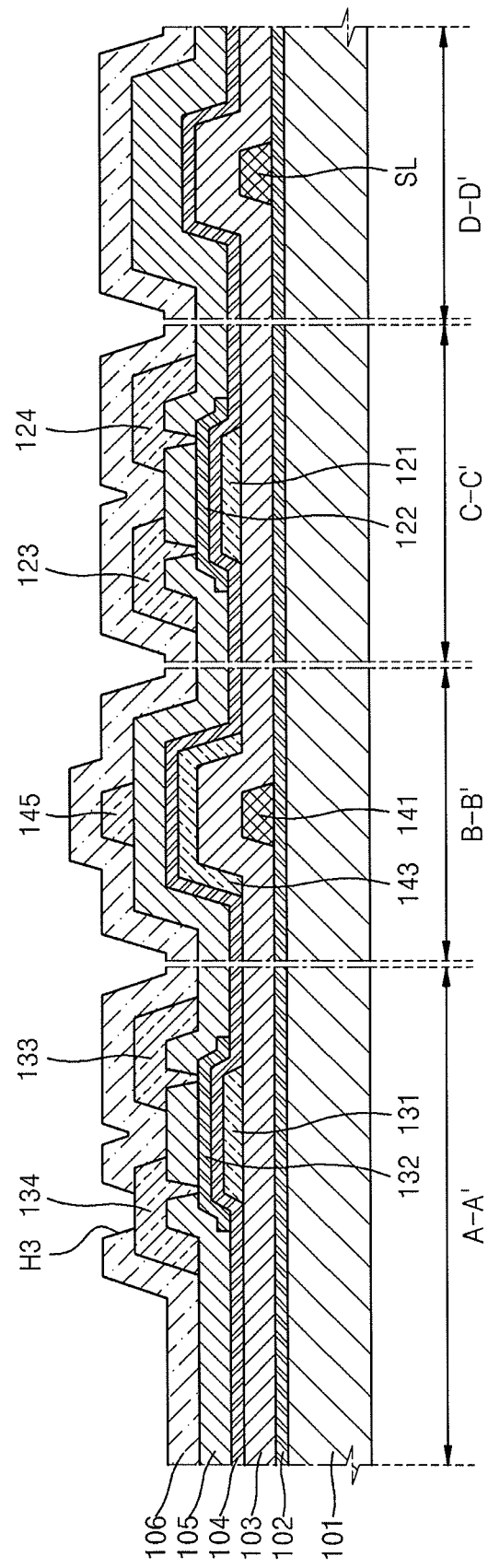

Subsequently, referring to FIG. 7, a fourth insulating layer 106 is stacked on the substrate 101, on which the source electrodes 123 and 133 and the drain electrodes 124 and 134 and the third capacitor electrode 145 are formed. Also, an opening H3 exposing a part of the drain electrode 134 of the driving transistor TRd is formed by masking with a sixth mask (not shown).

The fourth insulating layer 106 may be formed of at least one organic insulation material selected from the group of polyimide, polyamide, acrylic resin, benzocyclobutene, and phenol resin, or an inorganic insulation material, such as $SiN_x$. The fourth insulating layer 106 may be formed by alternating organic insulation materials and inorganic insulation materials. The fourth insulating layer 106 may have one of various structures such as a single layer structure or a double or multi-layered structure.

Figure 8:
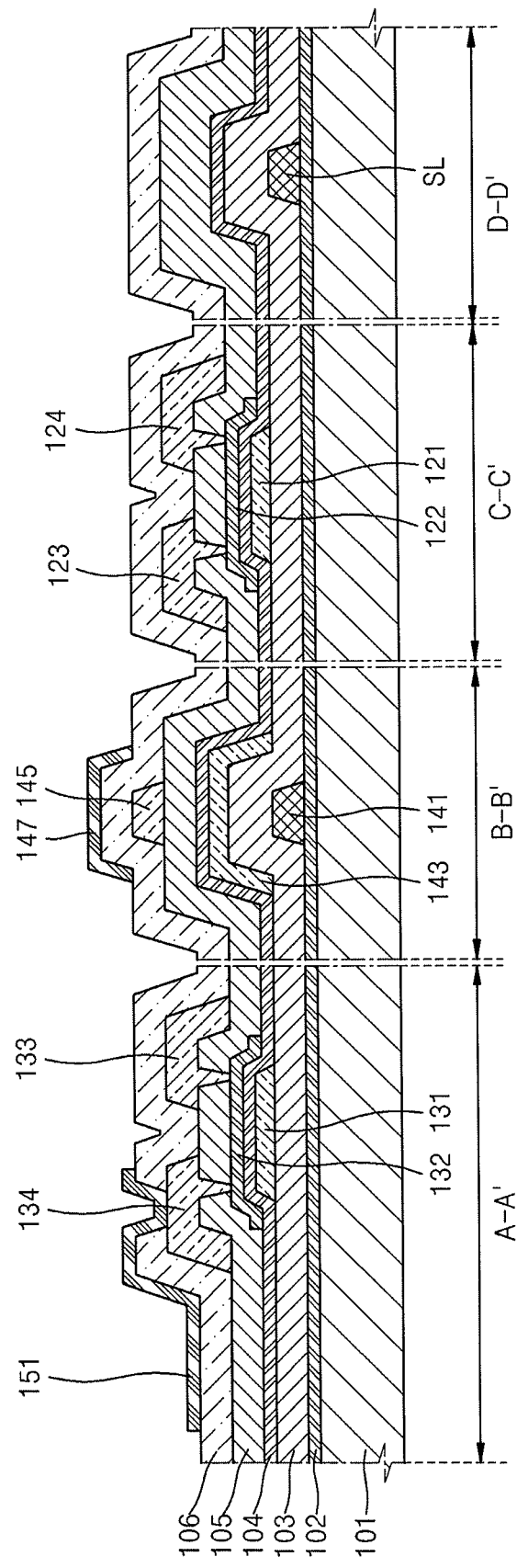

Next, as shown in FIG. 8, the pixel electrode 151 of the organic light-emitting layer EL and the fourth capacitor electrode 147 of the capacitor Cst are formed on the fourth insulating layer 106 by masking with a seventh mask (not shown).

A transparent conductive layer is stacked on the fourth insulating layer 106, and the transparent conductive layer is patterned to form the pixel electrode 151. The transparent conductive layer may include at least one selected from the group of ITO, IZO, ZnO, $In_2O_3$, IGO, and AZO.

The pixel electrode 151 is in contact with one of the source electrode 133 and the drain electrode 134 of the driving transistor TRd through the opening H3 of the fourth insulating layer 106. In an embodiment shown in FIG. 8, the pixel electrode 151 is in contact with the drain electrode 134.

Figure 9:
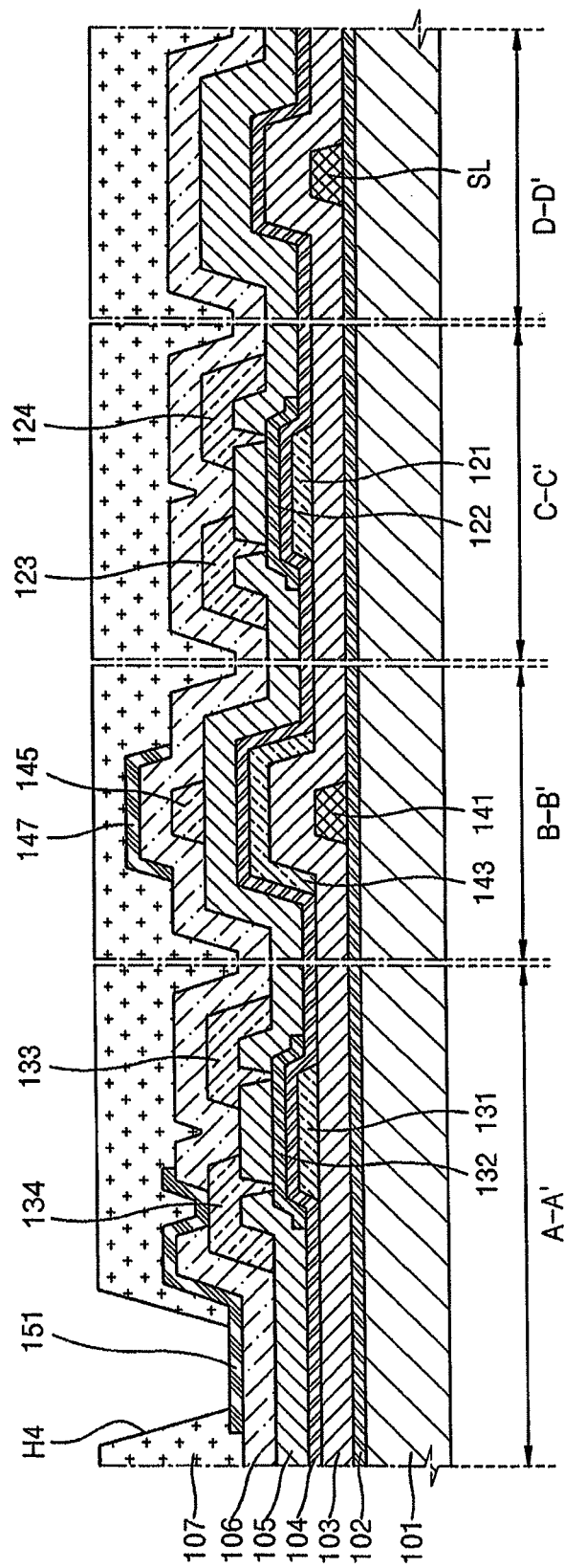

Referring to FIG. 9, a fifth insulating layer 107 is stacked on the pixel electrode 151 and the fourth capacitor electrode 147, and an opening H4 exposing a part of the pixel electrode 151 is formed by masking with a eighth mask (not shown).

The fifth insulating layer 107 may be formed of at least one organic insulation material selected from the group of polyimide, polyamide, acrylic resin, benzocyclobutene, and phenol resin, or at least one inorganic insulation material selected from the group of $SiO_2$, $SiN_x$, $Al_2O_3$, $CuO_x$, $Tb_4O_7$, $Y_2O_3$, $Nb_2O_5$, and $Pr_2O_3$. Also, the fifth insulating layer 107 may include alternating layers of organic insulation materials and inorganic insulation materials. The fifth insulating layer 107 serves as a pixel-defining layer which defines a pixel.

Figure 10:
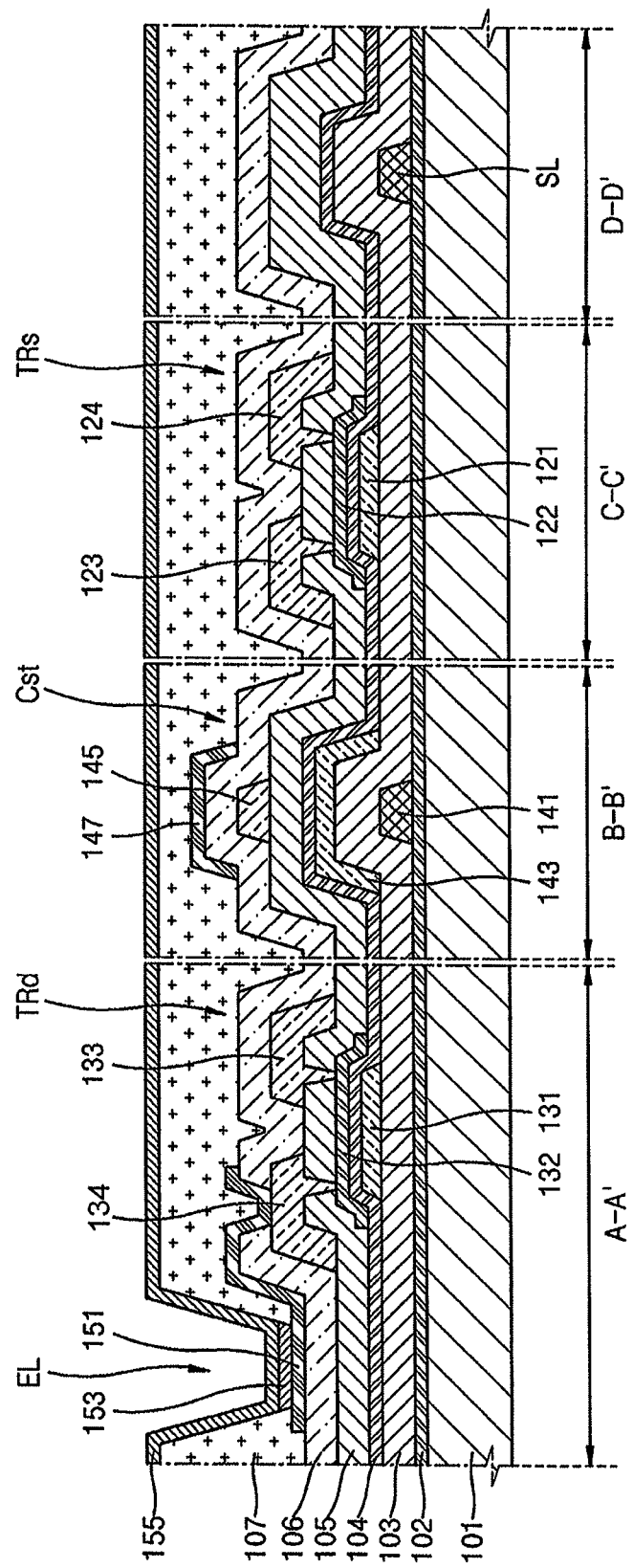

Next, as shown in FIG. 10, an interlayer 153, including an emission layer, is formed on the pixel electrode 151, and a counter electrode 155 is formed on an entire surface of the substrate 101 to cover the interlayer 153.

The interlayer 153 may be formed with an emissive layer (EML) and at least one functional layer, such as a hole transport layer (HTL), a hole injection layer (HIL), an electron transport layer (ETL), or an electron injection layer (EIL), that are stacked in a single or combined structure. The interlayer 153 may be formed of a small molecule material or a polymer organic material. When the interlayer 153 emits each of red, green, and blue lights, the EML may be patterned into a red EML, a green EML, and a blue EML, according to a red sub-pixel, a green sub-pixel, and a blue sub-pixel, respectively. When the interlayer 153 emits white light, the EML may have a multi-layer structure where a red EML, a green EML, and a blue EML are stacked, or a single layer structure including a red emission material, a green emission material, and a blue emission material.

The counter electrode 155 may be formed as a common electrode by deposition on the entire surface of the substrate 101. In the organic light-emitting display device according to an embodiment, the pixel electrode 151 is used as an anode, and the counter electrode 155 is used as a cathode, or vice versa.

According to an embodiment, the scan line SL formed of a low resistance wire and gate electrodes of TFTs are formed apart on different layers with an insulating layer therebetween. In this regard, the gate electrode of the TFT may be relatively thinner compared to the case when all of the scan line SL and the gate electrodes of TFTs are formed of a low resistance wire, and accordingly, a thickness of a gate insulating layer between the gate electrodes and the active layer may be thin. Thus, RC load of scan lines and a size of a TFT may be reduced, and thus an aperture ratio of a pixel may be increased. Also, according to an embodiment, the capacitor Cst may be formed as a triple capacitor with the first to fourth capacitor electrodes 141 to 147, thus an area of the capacitor Cst may be reduced while capacitance thereof is increased.

Figure 11:
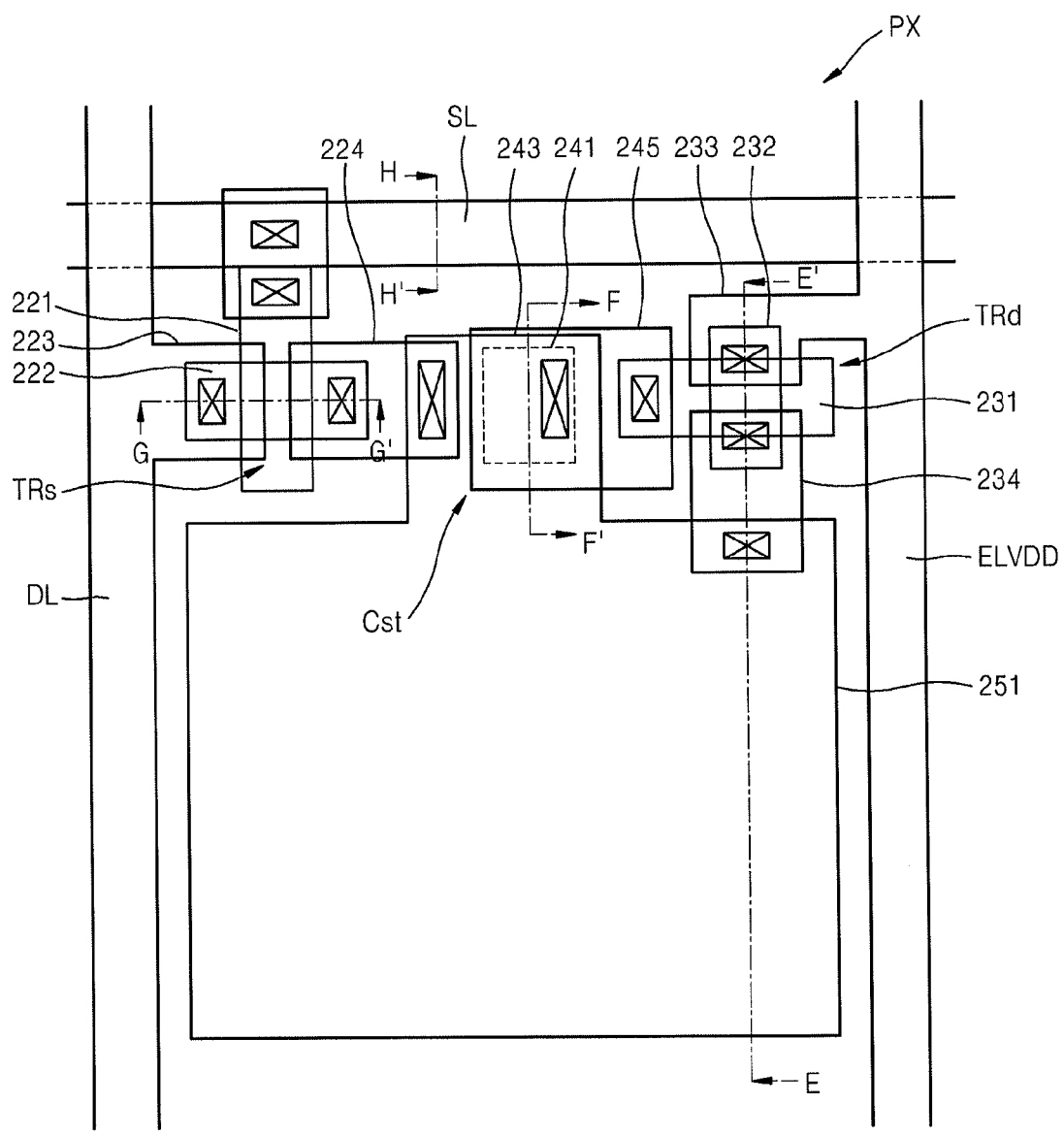
FIG. 11 is a plan view of a single pixel of an organic light-emitting display device according to another embodiment.

FIG. 11 is a plan view of a single pixel of an organic light-emitting display device according to another embodiment. The pixel shown in FIG. 11 is different from the pixel shown in FIG. 1 in that the number of masking process is less than the embodiment of FIG. 1 by forming a double capacitor having a pixel electrode, a gate electrode, and one electrode of the capacitor with the same material on the same layer.

The organic light-emitting display device according to the present embodiment includes a plurality of scan lines SL and a plurality of data lines DL on a substrate 201, and a plurality of pixels PX each located at an intersection region of the scan line SL and the data line DL. Referring to FIG. 11, each of the pixels PX includes an organic light-emitting diode EL for realizing colors in response to a data signal, a driving transistor TRd for applying driving current according to the data signal to the organic light-emitting diode EL, a switching transistor TRs that turns on/off the driving transistor TRd by transmitting the data signal according to a scan signal, and a capacitor Cst for storing voltage that corresponds to the data signal. Here, the pixel PX may further include a plurality of thin film transistors TFTs and capacitors to compensate for a threshold voltage of the driving transistor TRd.

The switching transistor TRs includes a gate electrode 221 on a layer above the scan line SL and on the same layer as the pixel electrode 251, an active layer 222 on the gate electrode 221, and source and drain electrodes 223 and 224 that are electrically connected to two terminal ends of the active layer 222 through contact holes. The gate electrode 221 is electrically connected to the scan line SL through contact holes. One of the source and drain electrodes 223 and 224 is electrically connected to the data line DL and the other is electrically connected to a second capacitor electrode 243 of the capacitor Cst through contact holes. One of the source and drain electrodes 223 and 224 that is electrically connected to the data line DL may be extended from and integrated with the data line DL.

The driving transistor TRd includes a gate electrode 231 on a layer above the scan line SL and on the same layer as the pixel electrode 251, an active layer 232 on the gate electrode 231, and source and drain electrodes 233 and 234 that are electrically connected to the two terminal ends of the active layer 232 through contact holes. The gate electrode 231 is electrically connected to a third capacitor electrode 245 of the capacitor Cst through contact holes. One of the source and drain electrodes 233 and 234 is electrically connected to a driving voltage supply line ELVDD, and the other is electrically connected to a pixel electrode 251 of the organic light-emitting diode EL through contact holes. One of the source and drain electrodes 233 and 234 that is electrically connected to a driving voltage supply line ELVDD may be extended from and integrated with the driving voltage supply line ELVDD.

The capacitor Cst includes a first capacitor electrode 241 on the same layer as the scan line SL, the second capacitor electrode 243 on the first capacitor electrode 241 and formed on the same layer as the gate electrodes 221 and 231 and the pixel electrode 251 of the organic light-emitting device EL, and a third capacitor electrode 245 on the second capacitor electrode 243 and formed on the same layer as source and drain electrodes 223 and 224 and 233 and 234. The first capacitor electrode 241 and the third capacitor electrode 245 are electrically connected through contact holes. The second capacitor electrode 243 may be extend from and may be integrated with the pixel electrode 251.

FIGS. 12 to 18 are cross-sectional views of FIG. 11 cut through lines E-E', F-F', G-G', and H-H' to describe stages in a method of manufacturing the organic light-emitting display device, according to an embodiment.

Referring to FIG. 12, a buffer layer 202 is formed on the substrate 201, a first mask (not shown) is formed on the buffer layer 202, and the scan line SL and the first capacitor electrode 241 of the capacitor Cst are formed on the buffer layer 202 by masking with a first mask (not shown).

The substrate 201 may be formed of a transparent glass material, mainly including $SiO_2$. However, the substrate 201 of the present embodiment is not limited thereto, and may be formed of various materials such as, for example, transparent plastic material or metal material.

The buffer layer 202 serves as a barrier layer and/or a blocking layer to prevent diffusion of impurity ions and permeation of moisture or external air, and to planarize a surface of the substrate 201. The buffer layer 202 may be formed using $SiO_2$ and/or $SiN_x$ by various deposition methods such as PECVD, APCVD, and LPCVD.

The scan line SL and the first capacitor electrode 241 may be formed simultaneously by stacking a first conductive layer on the substrate 201 and patterning the first conductive layer. The first conductive layer includes at least one metal material from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and the first conductive layer may be formed as a single layer or multiple layers. A first conductive layer including a metal material with a low resistance, such as Al or Cu, is preferred but the first conductive layer may include other metal materials to form the first conductive layer as a single layer or multiple layers with an increased thickness.

Next, as shown in FIG. 13, a first insulating layer 203 is formed on the substrate 201, and then, the pixel electrode 251 of the organic light-emitting diode EL, the gate electrode 231 of the driving transistor TRd, the gate electrode 221 of the switching transistor TRs, and the second capacitor electrode 243 of the capacitor Cst are formed on the first insulating layer 203 by masking with a second mask (not shown). The second capacitor electrode 243 has an overlapping area with the first capacitor electrode 241.

The first insulating layer 203 may be formed of at least one organic insulation material selected from the group of polyimide, polyamide, acrylic resin, benzocyclobutene, and phenol resin, or at least one inorganic insulation material selected from the group of $SiO_2$, $SiN_x$, $Al_2O_3$, $CuO_x$, $Tb_4O_7$, $Y_2O_3$, $Nb_2O_5$, and $Pr_2O_3$. Also, the first insulating layer 203 may include alternating layers of organic insulation materials and inorganic insulation materials.

The gate electrodes 221 and 231, the second capacitor electrode 243, and the pixel electrode 251 may be formed simultaneously by depositing a second conductive layer on the first insulating layer 203 and patterning the second conductive layer. The second conductive layer may be a transparent conductive electrode including at least one transparent conductive material selected from the group of ITO, IZO, ZnO, $In_2O_3$, IGO, and AZO.

Figure 14:
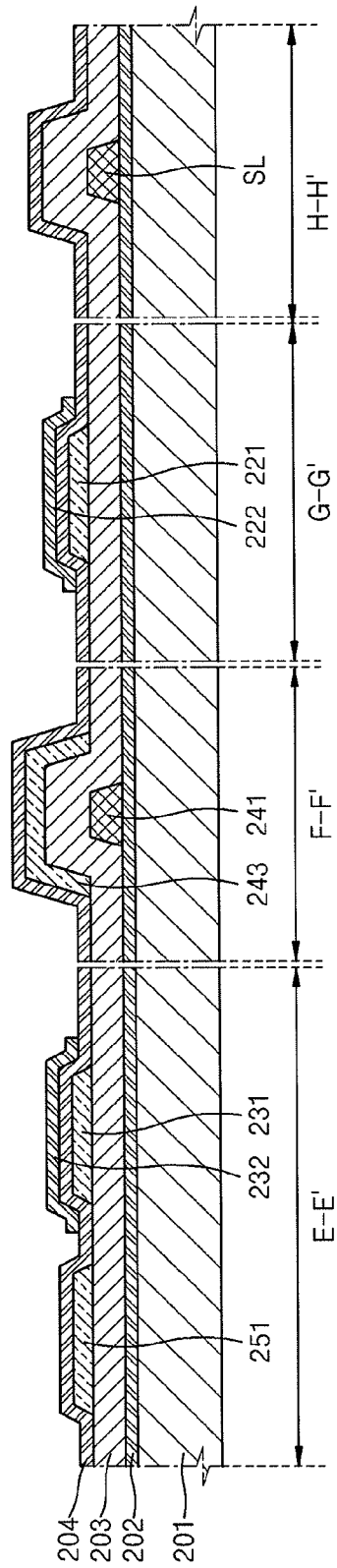

Referring to FIG. 14, the active layers 222 and 232 are formed on the gate electrodes 221 and 231, the second capacitor electrode 243, and the pixel electrode 251 by masking with a third mask (not shown).

A second insulating layer 204 and an oxide semiconductor are deposited on the substrate 201, on which the gate electrodes 221 and 231, the second capacitor electrode 243, and the pixel electrode 251 are formed, and then, the oxide semiconductor is patterned to form the active layers 222 and 232.

The second insulating layer 204 serves as a gate insulating layer and may be formed of an inorganic insulation material, such as $SiN_x$ or $SiO_x$, or an organic insulation material. According to an embodiment, the scan line SL formed by the first conductive layer and the gate electrodes 221 and 231 formed by the second conductive layer may be formed apart, the gate electrodes 221 and 231 may be formed thinner than the scan line SL, which is a wire with low resistance, and thus a thickness of the second insulating layer 204 may also be thin. Therefore, a size of a TFT may be reduced.

The active layers 222 and 232 each provide a channel region, a source region, and a drain region, wherein the channel region overlaps with the gate electrodes 221 and 231. The oxide semiconductor may contain at least one element selected from the group of gallium (Ga), indium (In), stannum (Sn), zirconium (Zr), hafnium (Hf), and vanadium (V). For example, the oxide semiconductor may include at least one selected from the group of ZnO, $SnO_2$, $In_2O_3$, $Zn_2SnO_4$, $Ga_2O_3$, and $HfO_2$. Also, the active layer 132 may be formed of a transparent oxide semiconductor. Examples of the transparent oxide semiconductor include, for example, Zn oxide, Sn oxide, Ga—In—Zn oxide, In—Zn oxide, and In—Sn oxide, but are not limited thereto.

Figure 15:
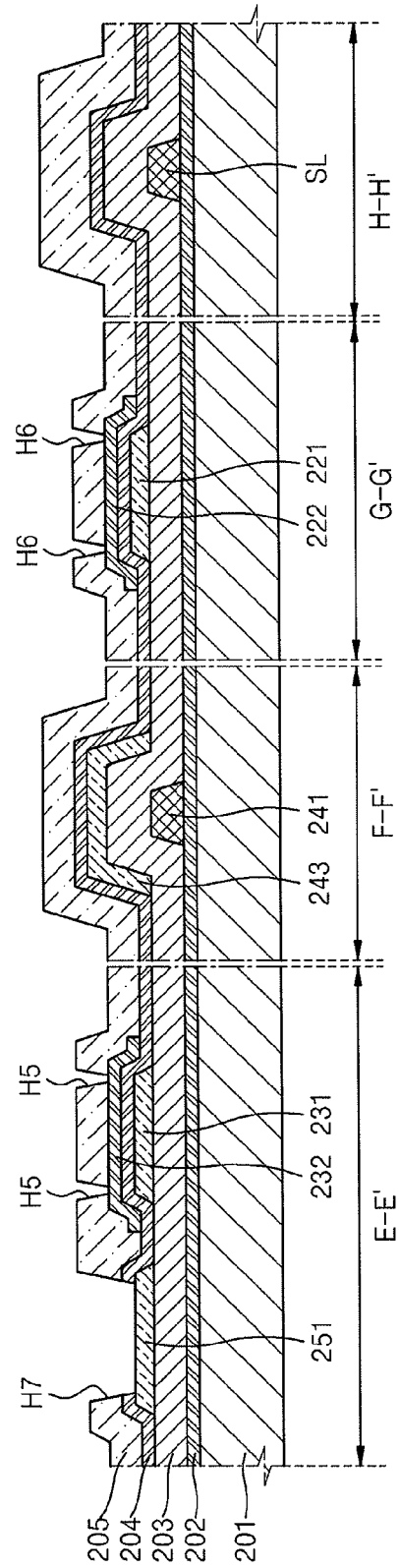

Referring to FIG. 15, a third insulating layer 205 is stacked on the active layers 222 and 232, and openings H5 and H6 exposing a part of the source and drain regions of the active layers 222 and 232 and an opening H7 exposing a part of the pixel electrode 251 are formed by masking with a fourth mask (not shown). The opening H7 is formed by etching the second insulating layer 204 and the third insulating layer 205.

The third insulating layer 205 serves as an inter-layer dielectric and may be formed of an inorganic insulation material, such as $SiN_x$ or $SiO_x$, or an organic insulation material.

Figure 16:
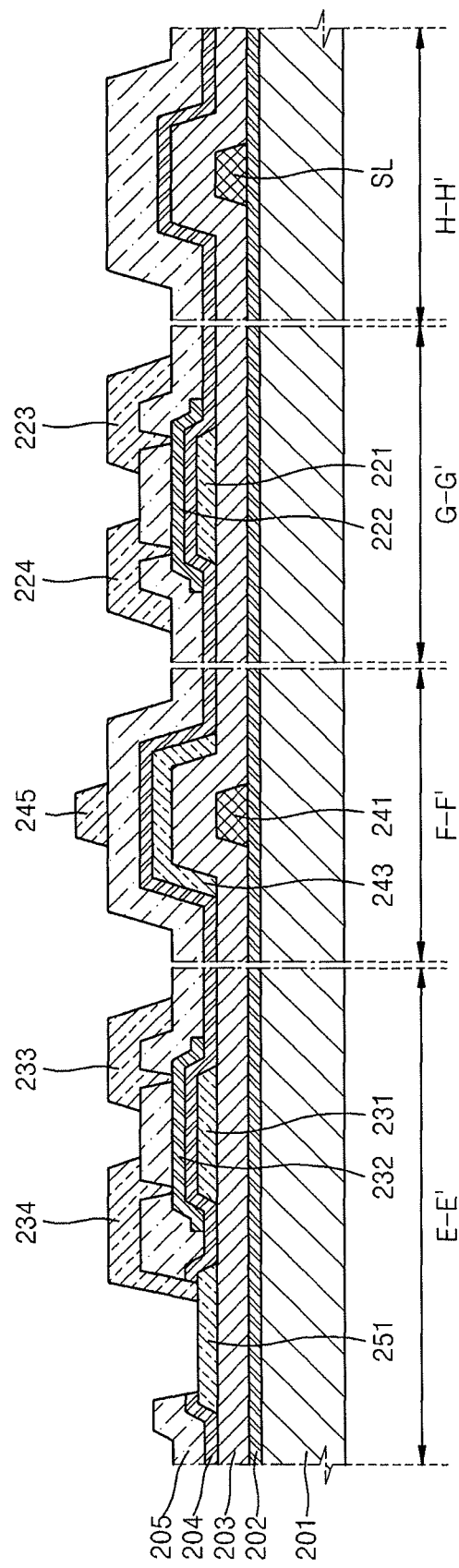

Next, referring to FIG. 16, the source electrode 233 and the drain electrode 234 of the driving transistor TRd, the source electrode 223 and the drain electrode 224 of the source transistor TRs, and the third capacitor electrode 245 of the capacitor Cst are formed by masking with a fifth mask (not shown).

The openings H5, H6, and H7 of the third insulating layer 205 are buried by a third conductive layer that is stacked on the third insulating layer 205. Then, the third conductive layer is patterned to form the source electrodes 223 and 233, the drain electrodes 224 and 234, and the third capacitor electrode 245. Here, one of the source electrode 233 and the drain electrode 234 of the driving transistor TRd may be in contact with a part of the pixel electrode 251. In the embodiment shown in FIG. 16, the drain electrode 234 is in contact with a part of the pixel electrode 251. The third conductive layer may include, for example, a metal such as Cr, Pt, Ru, Au, Ag, Mo, Al, W, Cu, or AlNd, or a conductive oxide such as ITO, GIZO, GZO, AZO, InZnO (IZO), or AlZnO (AZO) and may be formed as a single layer or multiple layers.

Also, the third capacitor electrode 245 of the capacitor Cst may be formed by patterning the third conductive layer at the same time the source electrodes 223 and 233 and the drain electrodes 224 and 234 are formed by patterning.

Although not shown in the drawings, the data line DL and the driving voltage supply line ELVDD may be formed at the same time when the source electrodes 223 and 233, the drain electrodes 224 and 234, and the third capacitor electrode 245 are formed.

Figure 17:
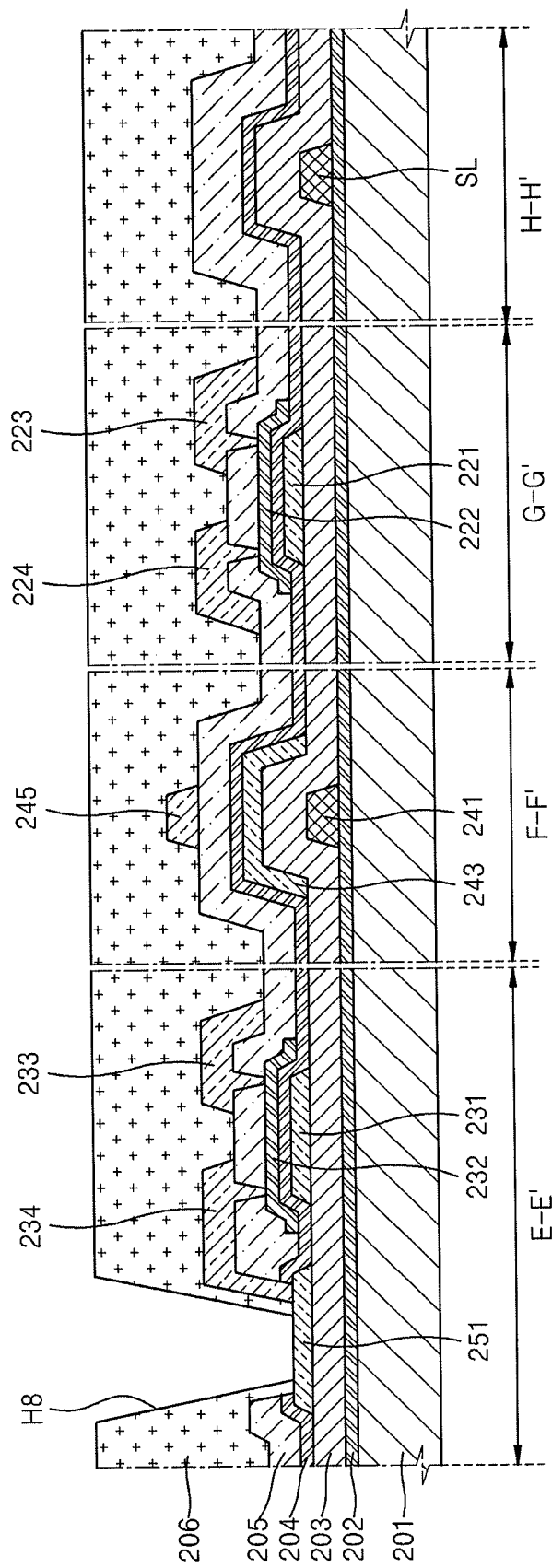

Subsequently, referring to FIG. 17, a fourth insulating layer 206 is stacked on the substrate 201, on which the source electrodes 223 and 233, the drain electrodes 224 and 234, and the third capacitor electrode 245 are formed. Also, an opening H8 exposing a part of the pixel electrode 251 is formed in the fourth insulating layer 206 by masking with a sixth mask (not shown).

The fourth insulating layer 206 may be formed of at least one organic insulation material selected from the group of polyimide, polyamide, acrylic resin, benzocyclobutene, and phenol resin, or at least one inorganic insulation material selected from the group of $SiO_2$, $SiN_x$, $Al_2O_3$, $CuO_x$, $Tb_4O_7$, $Y_2O_3$, $Nb_2O_5$, and $Pr_2O_3$. Also, the fourth insulating layer 206 may have alternating layers of organic insulation materials and inorganic insulation materials. The fourth insulating layer 206 serves as a pixel-defining layer which defines a pixel.

Figure 18:
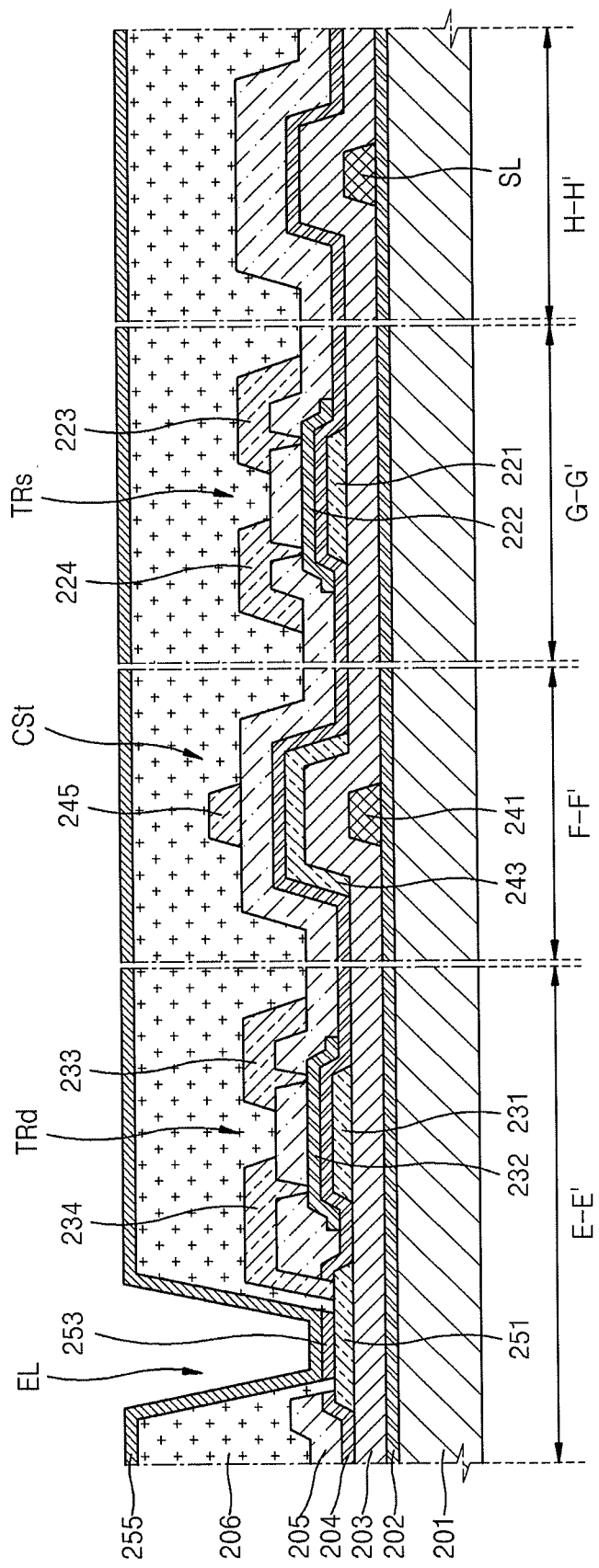

Next, as shown in FIG. 18, an interlayer 253, including an emission layer, is formed on the pixel electrode 251, and a counter electrode 255 is formed on an entire surface of the substrate 201 to cover the interlayer 253.

The interlayer 253 may be formed with an EML and at least one functional layer, such as an HTL, an HIL, an ETL, or an EIL, that are stacked in a single or combined structure. The interlayer 253 may be formed of a small molecule or a polymer organic material. When the interlayer 253 emits each of red, green, and blue lights, the EML may be patterned into a red EML, a green EML, and a blue EML, according to a red sub-pixel, a green sub-pixel, and a blue sub-pixel, respectively. When the interlayer 253 emits white light, the EML may have a multi-layer structure where a red EML, a green EML, and a blue EML are stacked, or a single layer structure including a red emission material, a green emission material, and a blue emission material.

The counter electrode 255 may be formed as a common electrode by deposition on the entire surface of the substrate 201. In the organic light-emitting display device according to an embodiment, the pixel electrode 251 is used as an anode, and the counter electrode 255 is used as a cathode, or vice versa.

By way of summation and review, according to embodiments, the scan lines SL formed of a low resistance wire and gate electrodes of TFTs are formed apart on different layers with an insulating layer therebetween. In this regard, the gate electrode of the TFT may be relatively thinner compared to the case when all of the scan line SL and the gate electrodes of TFTs are formed of a low resistance wire, and accordingly, a thickness of a gate insulating layer between the gate electrodes and the active layer may be thin. Thus, RC load of scan lines and a size of a TFT may be reduced, and thus an aperture ratio of a pixel may be increased. Also, according to an embodiment, the capacitor Cst may be formed as a double capacitor with the first to third capacitor electrodes 241 to 245, thus an area of the capacitor Cst may be reduced while capacitance thereof is increased.

In contrast, a conventional display device has scan lines and TFTs formed with the same low resistance wire. In this regard, however, the thicknesses of the gate electrodes and a gate insulating layer are increased. Thus an on-current of the TFT is reduced, a size of the TFT is increased, the number of parasitic capacitors is increased, and an area of a storage capacitor is increased. Accordingly, an aperture ratio of the conventional display device is reduced.

Although embodiments of organic light-emitting display devices have been described, the present invention is not limited thereto. Also, it would have been obvious to use a method of constructing a wire that separates scan lines from gate electrodes of TFTs and forms the scan lines as one electrode of a capacitor in various display devices including liquid display devices.

As described above, according to the one or more of the above embodiments, a wire forming scan lines SL and gate electrodes of TFTs are formed apart, thus RC load of scan lines, a size of a TFT, and an area of a storage capacitor may be reduced, and accordingly, an aperture ratio of a display device may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device including a plurality of scan lines and a plurality of data lines, and a plurality of pixels each located at an intersection region of the scan line and the data line, wherein the organic light-emitting display device comprises:
    a thin film transistor including a gate electrode on a different layer than a scan line, an active layer on the gate electrode, and source and drain electrodes in contact with source and drain regions of the active layer; and
    a capacitor including:
        a first capacitor electrode on a same layer as the scan line, the first capacitor electrode below both the gate electrode and the active layer,
        a second capacitor electrode overlapping and on the first capacitor electrode,
        a first insulating layer between the first capacitor electrode and the second capacitor electrode, the gate electrode and the second capacitor electrode on the first insulating layer,
        a third capacitor electrode on a same layer as the source and drain electrodes,
        a second insulating layer on the gate electrode and the second capacitor electrode and between the second capacitor electrode and the third capacitor electrode, and
        a third insulating layer between the second capacitor electrode and the third capacitor electrode.

2. The organic light-emitting display device of claim 1, wherein the active layer is formed of an oxide semiconductor.

3. The organic light-emitting display device of claim 1, wherein a thickness of the gate electrode is thinner than a thickness of the scan line.

4. The organic light-emitting display device of claim 1, wherein the scan line is a low resistance wire.

5. The organic light-emitting display device of claim 1, wherein the capacitor further comprises a fourth capacitor electrode on the third capacitor electrode.

6. The organic light-emitting display device of claim 5, further comprising a pixel electrode on one of the source and drain electrodes, wherein the pixel electrode is disposed on an upper suface of the one of the source and drain electrodes and on a same layer as the fourth capacitor electrode.

7. The organic light-emitting display device of claim 5, further comprising:
    a fourth insulating layer between the third capacitor electrode and the fourth capacitor electrode.

8. The organic light-emitting display device of claim 1, further comprising a pixel electrode on the same layer as the gate electrode and the second capacitor electrode.

9. The organic light-emitting display device of claim 1, wherein the scan line and the gate electrode are electrically connected through contact holes formed in an insulating layer between the scan line and the gate electrode.

10. A method of manufacturing an organic light-emitting display device, the method comprising:
    forming a first capacitor electrode on a same layer as a scan line;
    forming a first insulating layer on the first capacitor electrode;
    forming a gate electrode and a second capacitor electrode on the first insulating layer, the second capacitor electrode overlapping and on the first capacitor electrode;
    forming a second insulating layer on the gate electrode and the second capacitor electrode;
    forming an active layer that overlaps the gate electrode on the second insulating layer, the first capacitor electrode below both the gate electrode and the active layer;
    forming a third insulating layer on the active layer, the third insulating layer including openings which expose a part of source and drain regions of the active layer; and
    forming a third capacitor electrode and source and drain electrodes on the third insulating layer, the source and drain electrodes being in contact with the source and drain regions through the openings.

11. The method of claim 10, wherein the active layer is formed of an oxide semiconductor.

12. The method of claim 10, wherein a thickness of the gate electrode is thinner than a thickness of the scan line.

13. The method of claim 10, wherein the scan line is a low resistance wire.

14. The method of claim 10, further comprising:
forming a fourth insulating layer on the source and drain electrodes; and
forming a fourth capacitor electrode on the fourth insulating layer.

15. The method of claim 14, further comprising forming a pixel electrode on a same layer as the fourth capacitor electrode.

16. The method of claim 15, further comprising forming a fifth insulating layer, which has an opening that exposes a part of the pixel electrode, on the pixel electrode and the fourth capacitor electrode.

17. The method of claim 10, further comprising forming a pixel electrode on a same layer as the gate electrode and the second capacitor electrode.

18. The method of claim 17, further comprising forming a fourth insulating layer on the pixel electrode, the third insulating layer, the third capacitor electrode, and the source and drain electrodes, wherein the fourth insulating layer has an opening that exposes a part of the pixel electrode.

19. The method of claim 10, further comprising forming an electrode pattern that electrically connects the scan line and the gate electrode through contact holes formed in an insulating layer between the scan line and the gate electrode.

* * * * *